(12) United States Patent
Montez et al.

(10) Patent No.: US 8,592,926 B2
(45) Date of Patent: Nov. 26, 2013

(54) SUBSTRATE BONDING WITH METAL GERMANIUM SILICON MATERIAL

(75) Inventors: Ruben B. Montez, Cedar Park, TX (US); Alex P. Pamatat, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/273,389

(22) Filed: Oct. 14, 2011

(65) Prior Publication Data
US 2012/0068325 A1 Mar. 22, 2012

Related U.S. Application Data

(62) Division of application No. 12/356,939, filed on Jan. 21, 2009, now Pat. No. 8,058,143.

(51) Int. Cl.
*H01L 21/50* (2006.01)
*H01L 23/10* (2006.01)
*B81C 1/00* (2006.01)

(52) U.S. Cl.
USPC ............. 257/417; 257/704; 257/782; 438/51; 438/52; 438/118

(58) Field of Classification Search
USPC .......... 438/455; 257/678, 684, 690, 700, 729, 257/731, 782, 784, 786, E23.02, E23.023, 257/E23.04
See application file for complete search history.

(56) References Cited

U.S. PATENT DOCUMENTS

| | | | |
|---|---|---|---|
| 4,348,802 A | 9/1982 | Shirato | |
| 5,403,916 A | 4/1995 | Watanabe et al. | |
| 6,713,326 B2 | 3/2004 | Cheng et al. | |
| 6,818,938 B1 * | 11/2004 | Naem | 257/302 |
| 6,890,835 B1 | 5/2005 | Chu et al. | |
| 6,936,491 B2 | 8/2005 | Partridge et al. | |
| 8,119,431 B2 * | 2/2012 | Park et al. | 438/50 |
| 2002/0033485 A1 * | 3/2002 | Morosawa | 257/72 |
| 2005/0127499 A1 | 6/2005 | Harney et al. | |
| 2005/0127525 A1 | 6/2005 | Alie et al. | |
| 2006/0208326 A1 * | 9/2006 | Nasiri et al. | 257/414 |
| 2007/0001287 A1 | 1/2007 | Bosco et al. | |
| 2008/0283990 A1 | 11/2008 | Nasiri et al. | |
| 2010/0065934 A1 * | 3/2010 | Eriksen et al. | 257/419 |

FOREIGN PATENT DOCUMENTS

WO 2006/101769 A3 9/2006

OTHER PUBLICATIONS

Volkov et al.; "Structure and Mechanical Properties of Al-Si (Ge) Alloys upon Melt Centrifugation and Quenching" Abstract; Physics of the Solid State; May 2005; 1 page; vol. 47, No. 5; MAIK Nauka/Interperiodica.
Restriction mailed Feb. 4, 2011 in U.S. Appl. No. 12/356,939.
Office Action mailed Mar. 3, 2011 in U.S. Appl. No. 12/356,939.
Notice of Allowance mailed Sep. 1, 2011 in U.S. Appl. No. 12/356,939.

* cited by examiner

*Primary Examiner* — Olik Chaudhuri
*Assistant Examiner* — Quovaunda V Jefferson
(74) *Attorney, Agent, or Firm* — David G. Dolezal; James L. Clingan, Jr.

(57) ABSTRACT

In one embodiment, a semiconductor structure including a first substrate, a semiconductor device on the first substrate, a second substrate, and a conductive bond between the first substrate and the second substrate that surrounds the semiconductor device to seal the semiconductor device between the first substrate and the second substrate. The conductive bond comprises metal, silicon, and germanium. A percentage by atomic weight of silicon in the conductive bond is greater than 5%.

22 Claims, 5 Drawing Sheets

SUBSTRATE BONDING WITH METAL GERMANIUM SILICON MATERIAL

BACKGROUND OF THE INVENTION

1. Field of the Invention

This invention relates in general to semiconductor devices and more specifically for techniques for bonding enclosures of a semiconductor device.

2. Description of the Related Art

With some types of semiconductor devices such as micro electrical mechanical system (MEMS) devices, it is desirable to seal the device (e.g. hermetically) for the device to perform properly over time. For example, with some types of MEMS accelerometers, it is desirable to seal the MEMS accelerometer in a chamber to prevent contamination of the moving parts of a MEMS accelerometer during subsequent processes.

One method for sealing a MEMS device is to bond a cap wafer to a second wafer that includes the MEMS device. The cap wafer and the second wafer form a cavity for the MEMS device. The cap wafer may include a lead glass frit located around the cavity that bonds to the second wafer under pressure and temperature.

What is needed is an improved technique for bonding two wafers together to seal a semiconductor device such as a MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A cap wafer is bonded to a device wafer by a metal poly silicon germanium material to form a sealed chamber around a semiconductor device. On one wafer, a stack of silicon (Si), poly silicon germanium (SiGe), and poly germanium (Ge) is formed. A metal structure is formed on a second wafer. The metal silicon germanium material is formed by placing the metal structure and germanium structure in contact and applying heat (and pressure in some embodiments).

Figure 1:
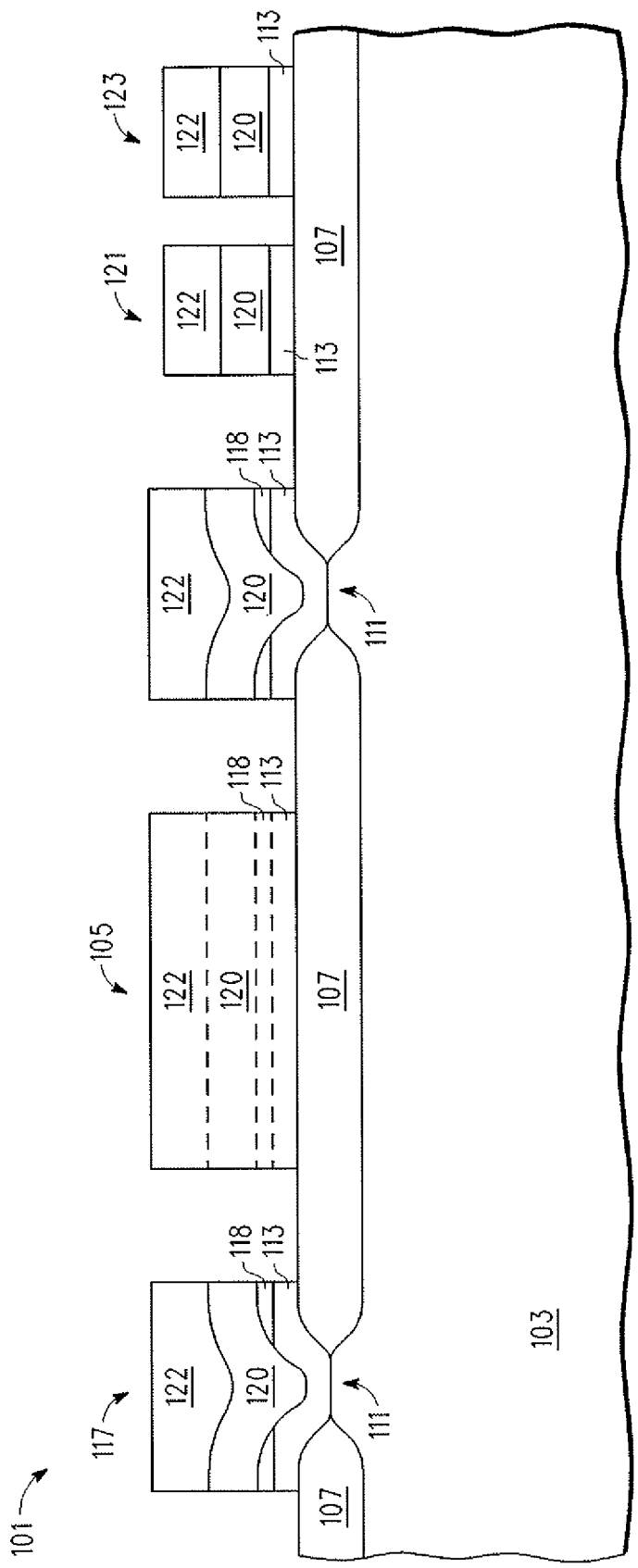
FIG. 1 is a partial cutaway side view of a device wafer at one stage of manufacture according to one embodiment of the present invention.
Figure 3:
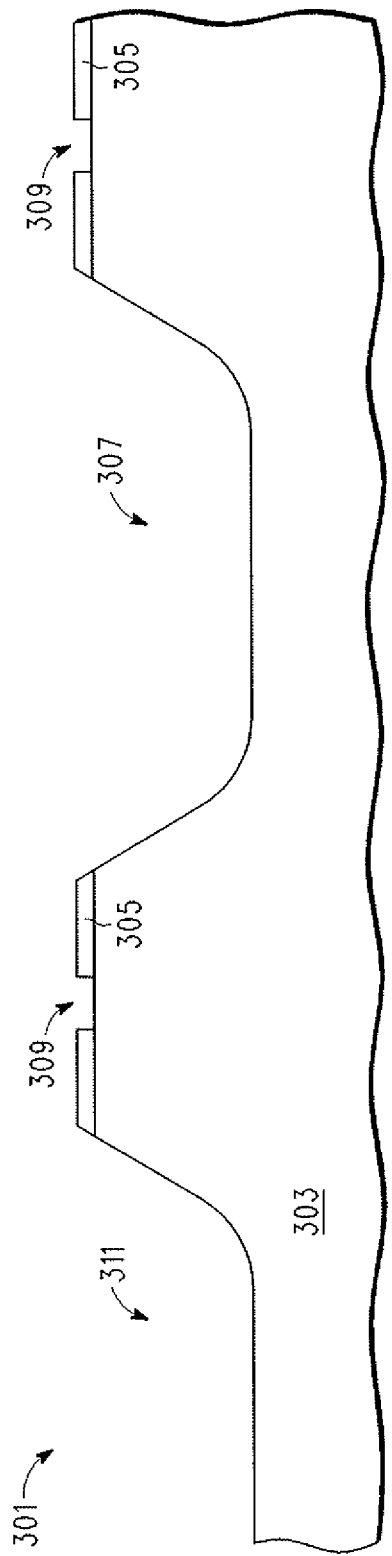
FIG. 3 is a partial cutaway side view of a cap wafer at a stage of manufacture according to one embodiment of the present invention.

FIG. 1 is a side view of a device wafer 101 that includes a semiconductor device 105 to be sealed with a cap wafer (e.g. 301 of FIG. 3). In one embodiment, device 105 is a MEMS device such as e.g. an accelerometer or switch. In one example of a MEMS device, device 105 includes a proof mass (not shown) made of polysilicon that is supported by springs and is movable with respect to substrate 103. In such an embodiment, device 105 includes capacitive structures whose capacitance can be measured to detect the movement of the proof mass. However, device 105 may be of other types of semiconductor devices in other embodiments. For example, in one embodiment, device 105 may be a transducer.

Wafer 101 includes a substrate 103 which in one embodiment is made of bulk monocrystalline silicon. An insulator layer 107 (e.g. $SiO_2$) is formed on substrate 103. In the embodiment shown, layer 107 is formed by a local oxidation of silicon (LOCOS) process, but may be formed by other methods in other embodiments. In one embodiment, the back side (not shown) of wafer 101 may be ground and polished. Layer 107 is formed with opening 111 located around the location of the subsequently formed semiconductor device 105. In other embodiments, opening 111 maybe formed by patterning layer 107. In one embodiment, layer 107 has a thickness of 25K Angstroms, but may be of other thicknesses in other embodiments.

After the formation of layer 107, polysilicon layers 113 and 120 (polycrystalline layers of silicon) and metal layer 122 are formed over layer 107. In one embodiment, layers 113, 120, and 122 are formed separately and then patterned prior to forming the next layer to form the desired structures of those layers. In some embodiments, dielectric layers e.g. layer 118 may be formed subsequently or prior to the forming of polysilicon layers 113 and 120 for the isolation of various structures formed from those layers. Also, sacrificial layers (not shown) may be used for forming the desired structures that are later removed in subsequent processes. In one embodiment, layer 118 may be of a silicon rich nitride material In the embodiment shown, device 105 includes layers 113, 118, 120, 122. In such a device, those layers maybe patterned to remove a portion of the layer at various locations in the device. However, for simplicity, device 105 is shown with those layers located in dashed lines all the way across device 105. In other embodiments, wafer 101, including device 105, may include other semiconductor layers and metal layers.

Wafer 101 includes a seal ring 117 surrounding device 105. Ring 117 is located over opening 111 wherein the polysilicon material of layer 113 is in contact with the silicon material of substrate 103 at opening 111.

Electrical contacts are also formed on wafer 101 with contacts 121 and 123 shown in FIG. 1. In the embodiment shown, contacts 121 and 123 include poly silicon layer 113, poly silicon layer 120, and metal layer 122 but do not include dielectric layer 118. Each contact is electrically coupled to a structure of device 105 by a polysilicon runner (e.g. 211 of FIG. 2) formed from layer 113.

In one embodiment, polysilicon layer 113 is 3500 Angstroms thick, but may be of other thicknesses in other embodiments. In one embodiment, layer 113 is doped with an impurity e.g. phosphorus to increase conductivity by ion implantation but may be doped with other impurities and by other methods in other embodiments.

In one embodiment, polysilicon layer 120 is 32K Angstroms thick but may be of other thicknesses in other embodiments. In one embodiment, layer 120 is doped with e.g. phosphorus by a doped oxide diffusion process, but may be doped with other impurities to improve conductivity and by other methods in other embodiments.

Metal layer 122 is formed over a patterned layer 120. In one embodiment, layer 122 is formed of aluminum. In one embodiment, layer 122 is formed of 99.5% aluminum (by atomic weight) and 0.5% copper (by atomic weight). However, layer 122 may be made of other metals or include other metals in other embodiments such gold, platinum, tungsten, titanium, cobalt, nickel, tin, and tantalum. In some embodiments, layer 122 may include some non metal materials such as germanium or silicon. In one embodiment, layer 122 includes 98% atomic weight or greater of a primary metal material (e.g. aluminum in some embodiments). In one embodiment, layer 122 has a thickness in the range of 3-4 microns, but maybe of other thicknesses in other embodiments.

In one embodiment, device 105 includes a portion of metal layer 122. In one embodiment, a portion of layer 122 is utilized to add weight to a proof mass of device 105.

In some embodiments, layer 122 is formed by physical vapor deposition, sputtering, evaporation, or plating. Layer 122 is subsequently patterned to form desired structures including on seal ring 117 and contacts 121 and 123.

Figure 2:
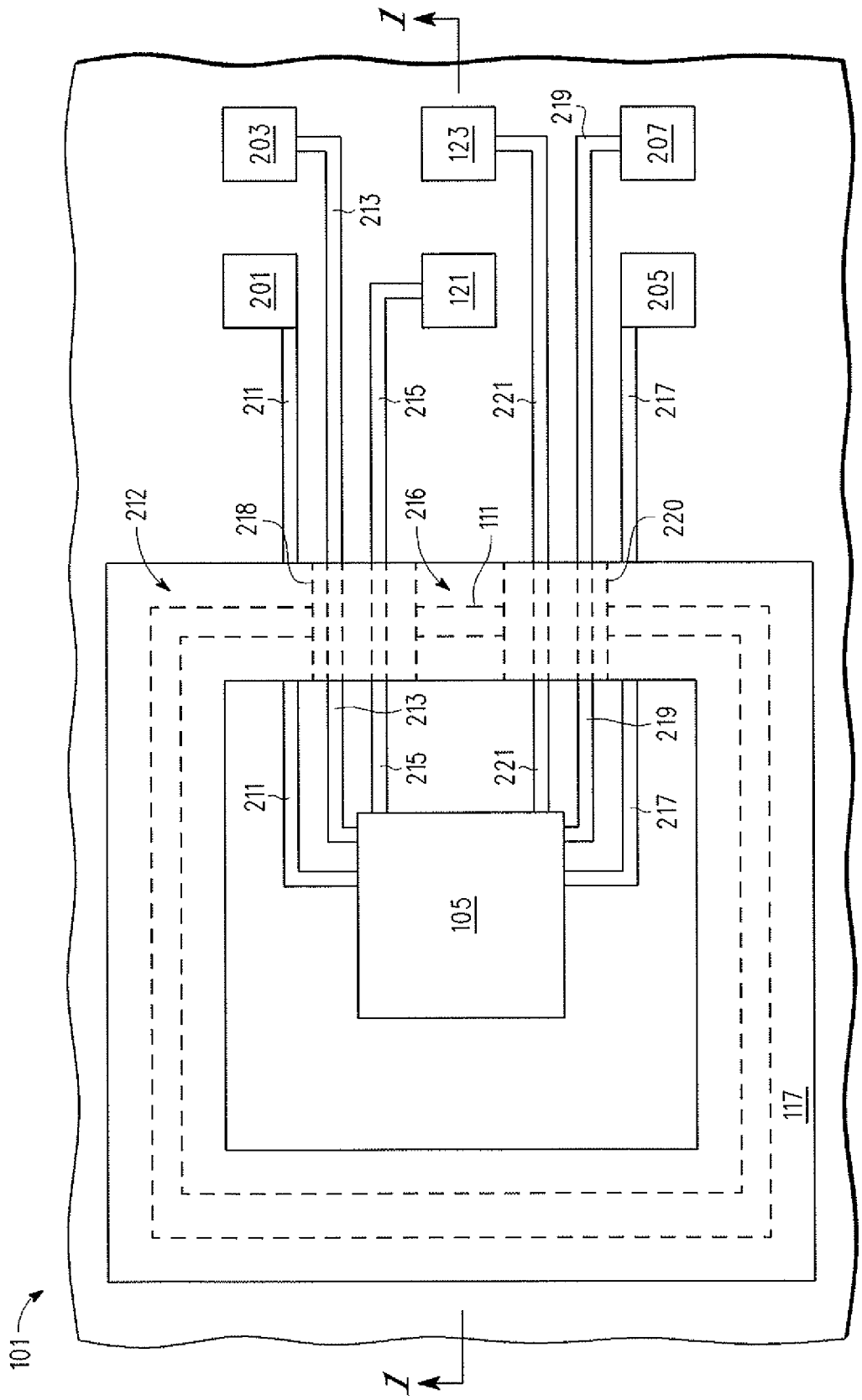
FIG. 2 is a partial top view of a device wafer at one stage of manufacture according to one embodiment of the present invention.

FIG. 2 shows a top view of wafer 101. Ring 117 is shown as having a rectangle shape located around device 105. Wafer 101 includes a number of contacts 201, 203, 121, 123, 205, and 207 that are electrically coupled by polysilicon runners 211, 213, 215, 221, 219 and 217 respectively, to structures of device 105. The runners are made of poly silicon from layer 113.

In the embodiment shown, runners 213, 215, 221, and 219 pass through ring 117. At these locations, layer 113 of ring 117 is electrically isolated from the runners by nitride layer 118 and by other dielectric material at locations lateral to the runners. In the embodiment shown, ring 117 includes two parts of layer 113. Part 212 appears a "C" structure starting at sidewall 218 and extending for three whole sides around device 105 to sidewall 220. The second part 216 is located between a first set of runners 211, 213, and 215, and a second set of runners 221, 219, and 217. Part 216 is separated from sidewall 218 to form an opening from runners 213 and 215 and part 216 is separated from sidewall 220 form an opening for runners 221 and 219.

Runners 211 and 217 are contiguous with the portion of layer 113 of ring 117. Thus, there are no dashed lines shown for these runners as crossing through ring 117 from the portion of the runners on the outside to the portion of the runners on the inside of the ring. Accordingly, ring 117 is electrically coupled to contacts 205 and 201. In one embodiment, contacts 205 and 201 serve as ground pads and are electrically coupled to substrate 103 by the runners and through conductive material in opening 111.

Opening 111 is located under those portions of layer 113 of ring 117 and runners 211 and 217 to provide ohmic contact to substrate 103. Opening 111 is not located under runners 213, 215, 221, and 219 in order to isolate those structures from substrate 103.

In other embodiments, the openings to the substrate 103 maybe at different locations, maybe of different sizes, and/or maybe of different shapes. For example, in one embodiment, openings 111 are located under ring 117 only at the locations where runners 211 and 217 extend through ring 117. In other embodiments, the substrate openings may be located under runners 211 and 217 at locations outside of ring 117. In one embodiment, substrate openings may be located under contacts 201 and 205.

After the formation of nitride dielectric layer 118, a dielectric layer e.g. silicon dioxide (not shown) is deposited over wafer 101. An opening is then formed in nitride layer 118 at those portions of ring 117. Layer 120 is subsequently formed over wafer 101. The portion of layer 120 of ring 117 is in contact with the portion of layer 113 of ring 117 via the openings of nitride layer 118.

FIG. 3 is a partial side cutaway view of cap wafer 301. In the embodiment shown, cap wafer 301 includes a bulk silicon substrate 303 and a layer of oxide 305 formed there over. In one embodiment, layer 305 is thermally grown, but in other embodiments, it may be deposited. Layer 305 is 4950 Angstroms thick, but may be of other thicknesses in other embodiments.

After the formation of layer 305, openings are formed in layer 305 at the locations of trenches 311 and 307. Wafer 301 is then subjected to an etch process (either wet or dry) to form trenches 311 and 307 in substrate 303. Afterwards, opening 309 is formed in layer 305 to expose substrate 303.

Figure 4:
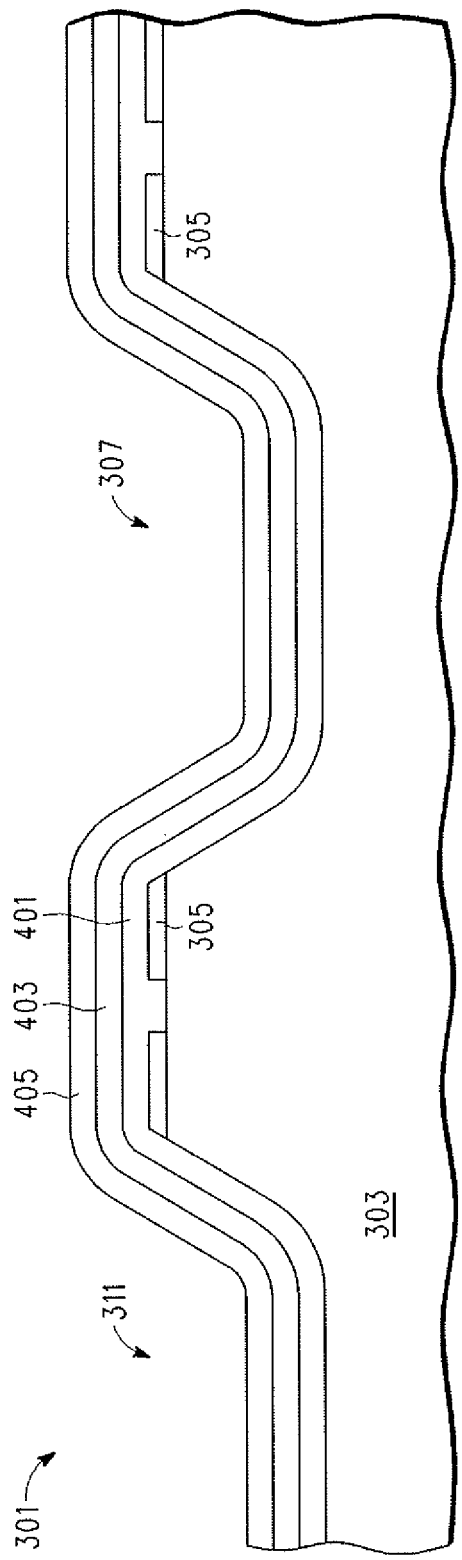
FIG. 4 is a partial cutaway side view of a cap wafer at another stage of manufacture according to one embodiment of the present invention.

Referring to FIG. 4, a polysilicon layer 401 is formed over wafer 301. In one embodiment, layer 401 has a thickness in the range of 750-2500 Angstroms, but may have other thicknesses in other embodiments. In one embodiment, layer 401 is formed by a chemical vapor deposition process (CVD), but may be formed of other processes in other embodiments. In one embodiment, layer 401 is formed by a process at a temperature greater than 550 degrees Celsius.

In some embodiments, Layer 401 acts as a seed layer for subsequently formed layer 403. Layer 403 is made of silicon germanium. In one embodiment, layer 403 includes germanium in a range of 20-40 atomic percent with the remainder being of silicon. However, other embodiments may have a different atomic percentage of germanium. In one embodiment, the germanium concentration of layer 403 may vary with a lower concentration of germanium at the bottom of layer 403 and a higher concentration of germanium at the top of layer 403, relative to the view shown in FIG. 4. In one embodiment, layer 403 is formed by a CVD process, but may be formed by other processes in other embodiments. In one embodiment, silicon germanium layer 403 has a thickness in the range of 500-2000 Angstroms, but may be of other thickness in other embodiments.

Layer 405 is formed over layer 403. Layer 405 is made of poly crystalline germanium. In one embodiment, layer 405 has a thickness in the range of 2000-4000 Angstroms, but may be of other thicknesses in other embodiments. In one embodiment, layer 405 is formed by a CVD process, but may be formed by other processes in other embodiments.

In some embodiments, the back side of wafer 301 may be ground and polished. Also in some embodiments, trenches (not shown) may be formed in the backside of wafer 301.

In one embodiment, polycrystalline layers 401, 403, and 405 are not doped with conductivity impurities (e.g. boron, phosphorous, arsenic). In other embodiments, they may be doped with conductivity or other types of impurities.

Figure 5:
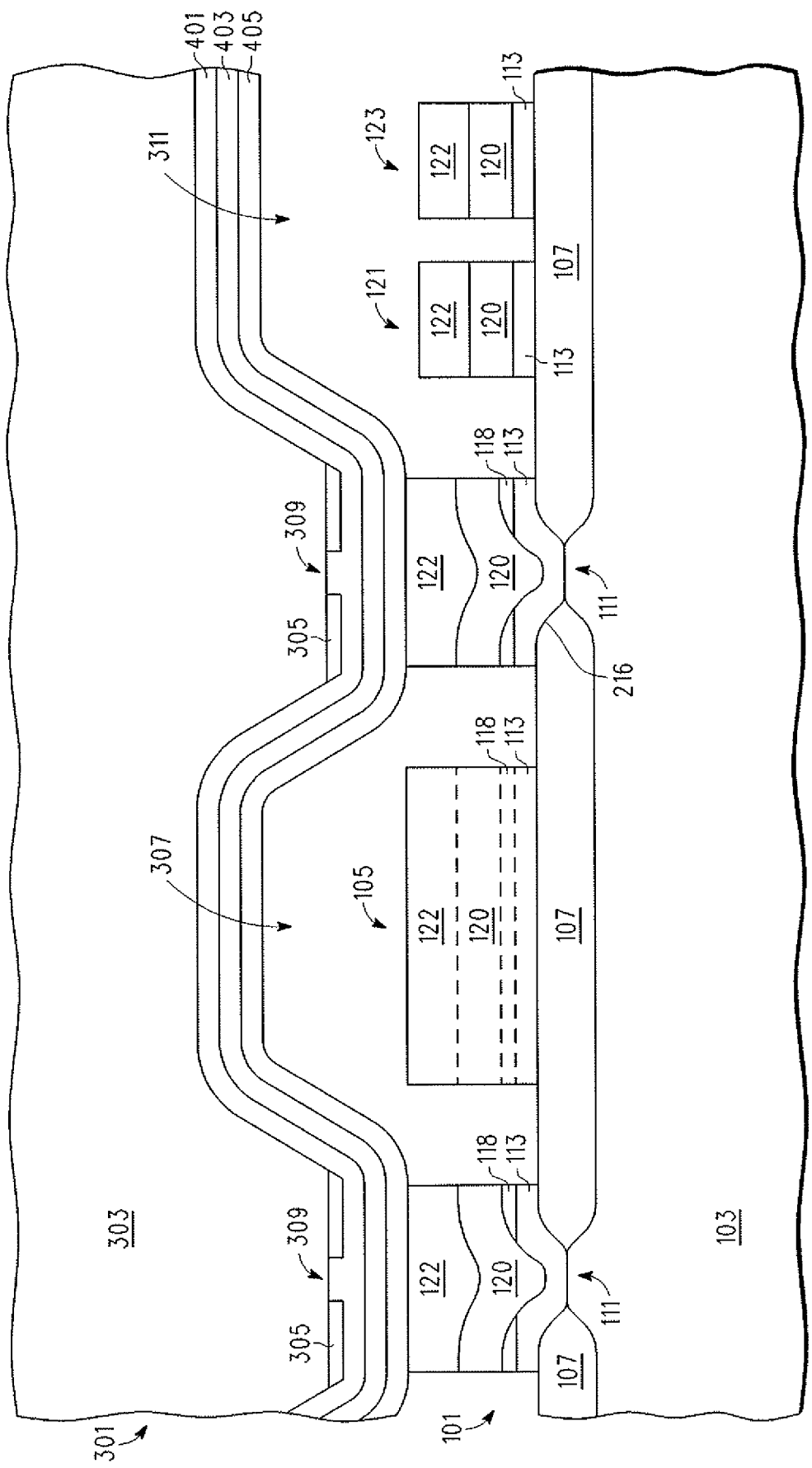
FIG. 5 is a partial cutaway side view of a cap wafer placed against the device wafer at a stage of manufacture according to one embodiment of the present invention.

FIG. 5 is a partial cutaway side view showing wafer 301 being brought into contact with wafer 101 where ring 117 is aligned to opening 309, trench 311 is located over contacts 121 and 123, and trench 307 is located over device 105. FIG. 5 shows both wafers just prior to the application of heat (and pressure in some embodiments) for bonding the two wafers together.

Figure 6:
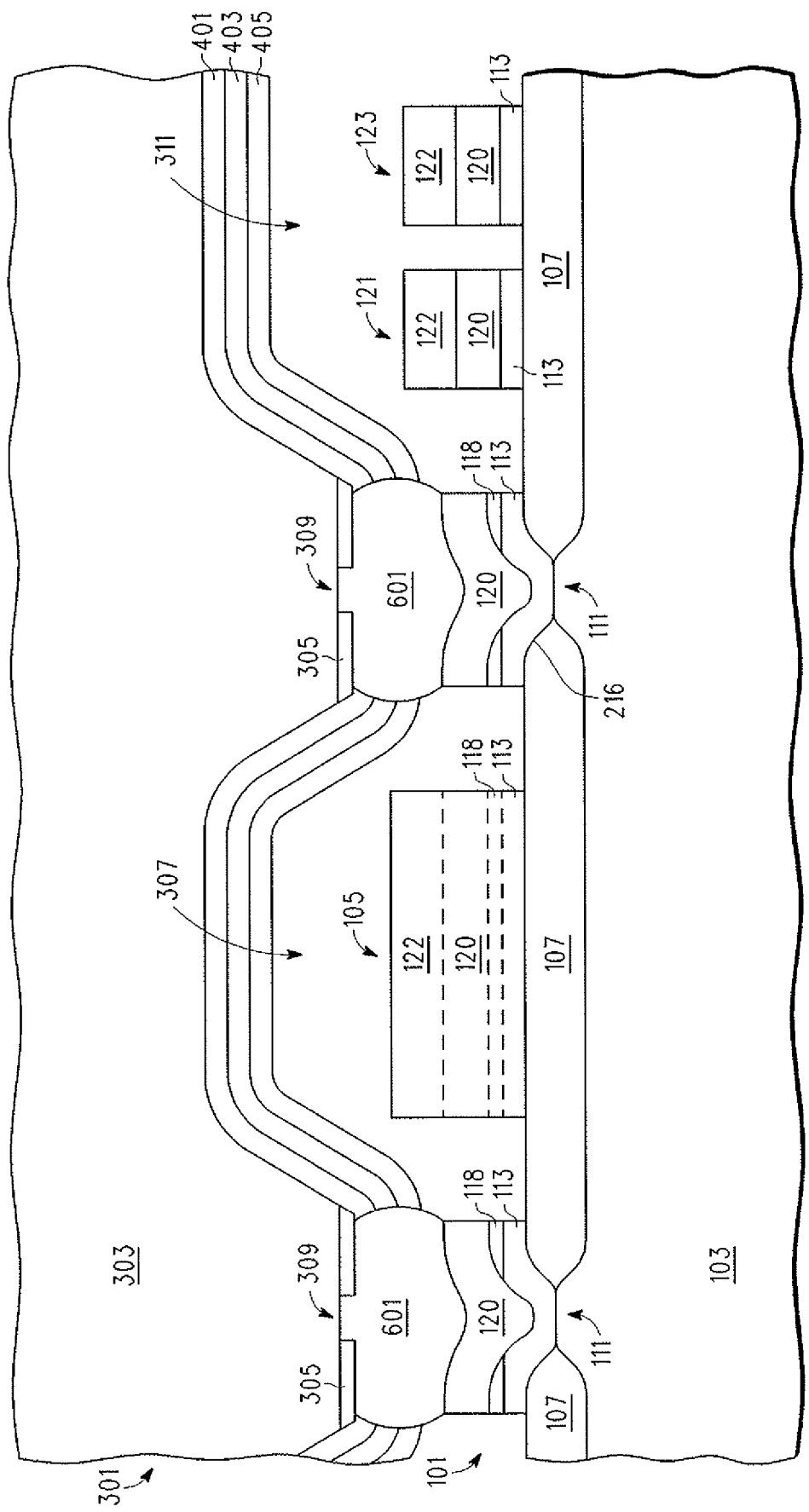
FIG. 6 is a partial cutaway side view of a cap wafer pressed against the device wafer at another stage of manufacture according to one embodiment of the present invention.

FIG. 6 is a partial cutaway side view after wafer 101 and 301 have been bonded together by applying heat to the to wafers. During the bonding process, the metal material of layer 122 of ring 117 reacts with the polysilicon of layer 401, the polycrystalline silicon germanium of layer 403, and the polycrystalline germanium of layer 405 to form a bonding material 601 of aluminum, silicon, and germanium. In one embodiment, this material 601 is a ternary system of aluminum (or other metal in other embodiments), silicon, and germanium. In one embodiment, aluminum (or other material of layer 122 in other embodiments) is the largest component by volume, followed by germanium, and then silicon. Material 601 is conductive. In one embodiment, material 601 may be described as a Al—Ge—Si eutectic compound. In one embodiment, material 601 may be described as a compound film. In one embodiment, the percentage by atomic weight of silicon of the material 601 is greater than 5%.

In embodiments where ring 117 completely surrounds device 105, material 601 provides for a hermetic seal for device 105 between wafers 101 and 301. In addition, because material 601 is conductive, in some embodiments, it provides for a conductive path (e.g. a ground path) between the two wafers.

The wafers are bonded at a temperature in the range of 425-500 C, and more preferably at a temperature in the range 450-475 C. However other temperatures may be used in other embodiments. The use of aluminum for layer 122 is preferable in that it may allow for the use of bonding temperatures below 500 degrees Celsius. In some embodiments, during the bonding process, the gap between substrate 303 and substrate 103 is reduced from its position shown in FIG. 5.

In some embodiments, the wafers are bonded together under pressure in addition to the application of heat. In one embodiment, a tool force pressure in the range of 5000-10,000 milibars is applied, with a preferable pressure in some embodiments of 6500 milibars. However in other embodiments, other applied bonding force pressures may be used.

In some embodiments, forming layer 405 of poly crystalline germanium by a CVD process (including plasma enhanced CVD processes) provides for a method of forming such a layer by a process that generates less particulates, which results in lower defect densities.

Furthermore, utilizing a CVD deposited, poly crystalline germanium layer provides the layer with a roughness that allows for better bonding with the material of layer 122 in some embodiments.

Forming a polycrystalline layer of germanium (e.g. layer 405) on a polycrystalline layer of silicon germanium (e.g. layer 403) may in some embodiments avoid the formation of voids in material 601 at the location where seed layer 401 is located. It is believed that using the intermediate silicon germanium layer 403 inhibits silicon migration from seed polysilicon layer 401 to layer 405 during the bonding process. Accordingly, utilizing the intermediate silicon germanium layer 403 results in material 601 being of a stronger and more uniform material.

The resultant wafer (wafer 101 and wafer 301 bonded together in FIG. 6) is further processed subsequent to the stage shown in FIG. 6. For example, the portion of substrate 303 may be removed to expose contacts 121 and 123 for external connection of those bond pads. Afterwards the resultant wafer is singulated into multiple die where each of the die includes a device similar to device 105 that is sealed with a material similar to material 601. Such die may be packaged for incorporation in electronic systems.

In some embodiments, cap wafer 301 may include semiconductor devices of an integrated circuit formed there on. For example, an integrated circuit (e.g. a microprocessor) may be formed in trench 307. The integrated circuit may be electrically coupled to device 105.

In the embodiment shown, the metal layer 122 of the ring 117 is formed on device wafer 101 and the polycrystalline layers 401, 403, and 405 are formed on wafer 301. In other embodiments, layers 401, 403, and 405 may be formed on the device wafer and be bonded to a metal ring formed on cap wafer 301.

In one embodiment, a method includes forming a layer including metal over a first substrate, providing a second substrate, and forming a first layer comprising silicon supported by the second substrate. The method also includes forming a second layer comprising germanium and silicon on the first layer, forming a third layer comprising germanium on the second layer, and contacting the third layer to the layer including metal. The method further includes after contacting the third layer to the layer including metal, forming a mechanical bonding material between the first substrate and the second substrate. The forming a mechanical bonding material includes applying heat to the third layer and the layer including metal. The bonding material includes a metal of the layer including metal and material of the third layer.

In another embodiment, a method for providing a seal between a first substrate and a second substrate includes contacting the first substrate to the second substrate through a bonding stack. The bonding stack includes a first layer comprising silicon, a second layer comprising germanium and silicon in contact with the first layer, a third layer comprising germanium in contact with the second layer, and a layer including metal in contact with the third layer. The method includes applying heat and pressure to the bonding stack so that the bonding stack becomes a bond between the first and second substrates.

In another embodiment, a semiconductor structure includes a first substrate, a semiconductor device on the first substrate, a second substrate, and a conductive bond between the first substrate and the second substrate that surrounds the semiconductor device to seal the semiconductor device between the first substrate and the second substrate. The conductive bond comprises metal, silicon, and germanium. An atomic percent of silicon in the conductive bond is greater than 5%.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor structure, comprising:
   a first substrate;
   a semiconductor device on the first substrate, a second substrate;
   a conductive bond between the first substrate and the second substrate that surrounds the semiconductor device to seal the semiconductor device between the first substrate and the second substrate, wherein:
      the conductive bond comprises metal, silicon, and germanium;
   a multilayer stack located between the first substrate and the second substrate and formed on one of the first substrate or the second substrate, the multilayer stack includes a first layer comprising silicon, a second layer comprising polycrystalline silicon germanium, and a third layer comprising polycrystalline germanium, wherein the first layer is located closest to the one of the first substrate or the second substrate, the third layer is located furthest from the one of the first substrate or the second substrate, and the second layer is located between the first layer and the third layer;

wherein the conductive bond includes material formed from material of the first layer, material of the second layer, and material the third layer.

2. The structure of claim 1, wherein the metal includes aluminum.

3. The structure of claim 2, wherein the conductive bond includes a material that is characterized a ternary system including aluminum, silicon, and germanium.

4. The structure of claim 1, wherein the conductive bond is characterized as a eutectic compound including aluminum, germanium, and silicon.

5. The structure of claim 1 wherein the second substrate includes a cavity located on an inner side of the second substrate facing the first substrate within the seal, the cavity overlying the semiconductor device, wherein a portion of the multilayer stack is located in the cavity.

6. The structure of claim 1, wherein the semiconductor device is further characterized by the semiconductor device being a micro electromechanical system (MEMS) device.

7. The structure of claim 1 where the first substrate includes a bond pad electrically coupled to a structure of the semiconductor device, the bond pad is located outside the seal of the conductive bond.

8. The structure of claim 1 where the seal is characterized as a hermetic seal.

9. The structure of claim 1 wherein the first layer includes polycrystalline silicon.

10. The structure of claim 1 wherein the multilayer stack is formed on the second substrate.

11. The structure of claim 10 wherein the second substrate is part of a cap for the semiconductor device.

12. The structure of claim 1 wherein the first layer has a thickness in a range of 750-2500 Angstroms, the second layer has a thickness in a range of 500-2000 Angstroms, and the third layer has a thickness in a range of 2000-4000 Angstroms.

13. The structure of claim 1 wherein a germanium content of the second layer is in a range of 20-40 atomic percent.

14. A semiconductor structure, comprising:
a first substrate;
a micro electromechanical system (MEMS) device on the first substrate,
a second substrate;
a conductive bond between the first substrate and the second substrate that surrounds the MEMS device to hermetically seal the MEMS device between the first substrate and the second substrate, wherein:
the conductive bond is characterized as a eutectic compound that includes aluminum, germanium, and silicon;
a multilayer stack located between the first substrate and the second substrate and formed on one of the first substrate or the second substrate, the multilayer stack includes a first layer comprising silicon, a second layer comprising silicon germanium, and a third layer comprising germanium, wherein the first layer is located closest to the one of the first substrate or the second substrate, the third layer is located furthest from the one of the first substrate or the second substrate, and the second layer is located between the first layer and the third layer;
wherein the multilayer stack extends to the conductive bond.

15. The structure of claim 14 where the first substrate includes a bond pad electrically coupled to a structure of the MEMS device, the bond pad is located outside the hermetic seal of the conductive bond.

16. The structure of claim 14 wherein the second substrate includes a cavity located on an inner side of the second substrate facing the first substrate within the seal, the cavity overlying the MEMS device, wherein a portion of the multilayer stack is located in the cavity.

17. The structure of claim 14 wherein the first layer includes polycrystalline silicon, the second layer includes polycrystalline silicon germanium, and the third layer includes polycrystalline germanium.

18. The structure of claim 14 wherein the multilayer stack is formed on the second substrate.

19. A semiconductor structure, comprising:
a first substrate;
a micro electromechanical system (MEMS) device on the first substrate,
a second substrate;
a conductive bond between the first substrate and the second substrate that surrounds the MEMS device to hermetically seal the MEMS device between the first substrate and the second substrate, wherein:
the conductive bond is characterized as a eutectic compound that includes aluminum, germanium, and silicon;
a multilayer stack located between the first substrate and the second substrate and formed on one of the first substrate or the second substrate, the multilayer stack includes a first layer comprising silicon, a second layer comprising silicon germanium, and a third layer comprising germanium, wherein the first layer is located closest to the one of the first substrate or the second substrate, the third layer is located furthest from the one of the first substrate or the second substrate, and the second layer is located between the first layer and the third layer;
wherein the conductive bond includes material formed from material of the first layer, material of the second layer, and material the third layer.

20. The structure of claim 19 wherein the multilayer stack extends to the conductive bond.

21. A semiconductor structure, comprising:
a first substrate;
a semiconductor device on the first substrate,
a second substrate;
a conductive bond between the first substrate and the second substrate that surrounds the semiconductor device to seal the semiconductor device between the first substrate and the second substrate, wherein:
the conductive bond comprises metal, silicon, and germanium;
a multilayer stack located between the first substrate and the second substrate and formed on one of the first substrate or the second substrate, the multilayer stack includes a first layer comprising silicon, a second layer comprising polycrystalline silicon germanium, and a third layer comprising polycrystalline germanium, wherein the first layer is located closest to the one of the first substrate or the second substrate, the third layer is located furthest from the one of the first substrate or the second substrate, and the second layer is located between the first layer and the third layer;
wherein the multilayer stack extends to the conductive bond.

22. The structure of claim 21 wherein the conductive bond includes material formed from material of the first layer, material of the second layer, and material the third layer.

* * * * *